US005675508A

United States Patent [19]
Kapadia

[11] Patent Number: 5,675,508
[45] Date of Patent: Oct. 7, 1997

[54] TRANSCODER TEST METHOD

[75] Inventor: Mayank Kapadia, Swindon, United Kingdom

[73] Assignee: Motorola, Inc., Schaumburg, Ill.

[21] Appl. No.: 440,289

[22] Filed: May 12, 1995

[30]  Foreign Application Priority Data

May 14, 1994 [GB] United Kingdom ............ 9409702

[51] Int. Cl.$^6$ .................................................. H03M 13/00
[52] U.S. Cl. .......................... 364/514 B; 371/25.1; 381/36
[58] Field of Search ................... 364/514 B; 371/25.1; 381/36

[56]  References Cited

U.S. PATENT DOCUMENTS

| 4,967,412 | 10/1990 | Cain et al. ............... | 371/20.1 |
| 5,003,554 | 3/1991 | Chism ...................... | 375/219 |
| 5,278,944 | 1/1994 | Sasaki et al. ............ | 395/2.21 |
| 5,438,569 | 8/1995 | Kapadia et al. .......... | 370/79 |
| 5,490,235 | 2/1996 | Von Holten et al. ..... | 395/2.79 |

FOREIGN PATENT DOCUMENTS

| 2269079 | 1/1994 | United Kingdom . |
| 2273024 | 6/1994 | United Kingdom . |

*Primary Examiner*—Melvin Marcelo
*Attorney, Agent, or Firm*—Donna Rogers Maddox

[57]  ABSTRACT

A method of testing a speech transcoder is provided for testing a speech transcoder including at least a speech decoder module connected to a PCM format conversion module where the method of testing includes inputting a standard input vector into an input of the decoder module and outputting a reference vector from the PCM format conversion module.

In an alternate embodiment, the method of testing a speech transcoder having a first PCM format conversion module connected to a speech coder module includes inputting a reference vector into the first PCM format conversion module and outputting a new vector from the speech coder that is equivalent to standard speech coder output or equivalent to a vector that was generated by inputting standard speech coder input into a combination of two PCM conversion modules and a reference speech coder.

7 Claims, 5 Drawing Sheets

-PRIOR ART-

TRANSCODER TEST METHOD

FIELD OF THE INVENTION

This invention relates in general to speech transcoders, and more particularly to a method for testing speech transcoders.

BACKGROUND TO THE INVENTION

In digital communications systems there are components that encode and decode speech for communications to and from the switching system. In GSM (Global System for Mobile Communications) a speech transcoder provides the encoding and decoding ability in one component and is sometimes referred to as a speech codec. The GSM speech transcoder is defined by GSM Recommendation 06.10 to be 16 bit exact. The correctness of implementation is tested using predefined test vectors. These test vectors define input sequences and respective output sequences. Each input sequence is defined to yield only one unique output sequence.

The GSM speech transcoder can be located at the GSM Base Transceiver Station (BTS) or at the GSM Base Station Controller/Mobile Switching Centre (BSC/MSC).

There are four modules within the speech transcoder that are tested using bit exact sequences. Each module is tested independently. The four modules are the speech coder, speech decoder, the Alaw to linear PCM format conversion, and the linear to Alaw PCM format conversion.

The standard interfaces to the speech coder are 64 kbits/s Alaw PCM and 13 or 16 kbit/s compressed speech. The standard interfaces to the speech decoder are 13 or 16 kbit/s compressed speech and 64 kbits Alaw PCM.

Each of the modules of the speech transcoder is tested independently largely due to the quantization effects of the PCM format conversion modules. The tests are defined by GSM Recommendations 06.10 and 11.20. Each test requires the input or output of 104 kbit/s (or 128 kbit/s) linear PCM which is not a standard interface to the speech transcoder. Specifically the test for Alaw to linear conversion is from 64 kbit/s to 104 kbit/s, the test for the speech coder is from 104 kbit/s to 13 (or 16) kbit/s, the test for the speech decoder from 13 (or 16) kbit/s to 104 kbit/s, and the test for the linear to Alaw from 104 kbit/s to 64 kbit/s.

For testing purposes each of the modules are isolated and tested independently. Referring to FIG. 1, the full rate speech decoder module 16 is tested by inputting test vectors into input 30 and outputting a test speech decoder output 36. The linear to Alaw PCM conversion module 18 is tested by directly inputting test vectors into a test PCM converter interface 32 and outputting an output at the standard PCM converter output interface 34. The Alaw to linear PCM conversion module 12 is tested by inputting test vectors at the standard PCM input interface 20 and outputting at test PCM converter interface 24. Input test vectors are inputted to a test speech coder input interface 22 of the full rate speech coder 14 and output is then provided at the standard speech coder output interface 26. Thus, for each module an additional test interface must be provided.

Due to the need to input or output linear PCM in each test and the fact that only one module is being tested at any one time, the need to have any of the other three modules running during the test becomes a discretionary item with the manufacturer. Hence, there is a potential problem that although each of the four modules are tested independently, there is no guarantee or separate test that ensures that all four modules will operate in such a way as to not disturb the other three modules when they are all working together in normal operational mode. Thus, it is desirable to be able to test the four modules simultaneously in normal operational mode.

SUMMARY OF THE INVENTION

According to the present invention a method of testing a speech transcoder including at least a speech decoder module connected to a PCM format conversion module where the method of testing includes the steps of inputting a standard input vector into an input of the decoder module and outputting a reference vector from the PCM format conversion module.

In an alternate embodiment, the method of testing a speech transcoder having a first PCM format conversion module connected to a speech coder module includes the steps of inputting a reference vector into the first PCM format conversion module and outputting a new vector from the speech coder that is equivalent to standard speech coder output or equivalent to a vector that was generated by inputting standard speech coder input into a combination of two PCM conversion modules and a reference speech coder.

DETAILED DESCRIPTION OF THE PREFERRED EMBODIMENT

Figure 1:
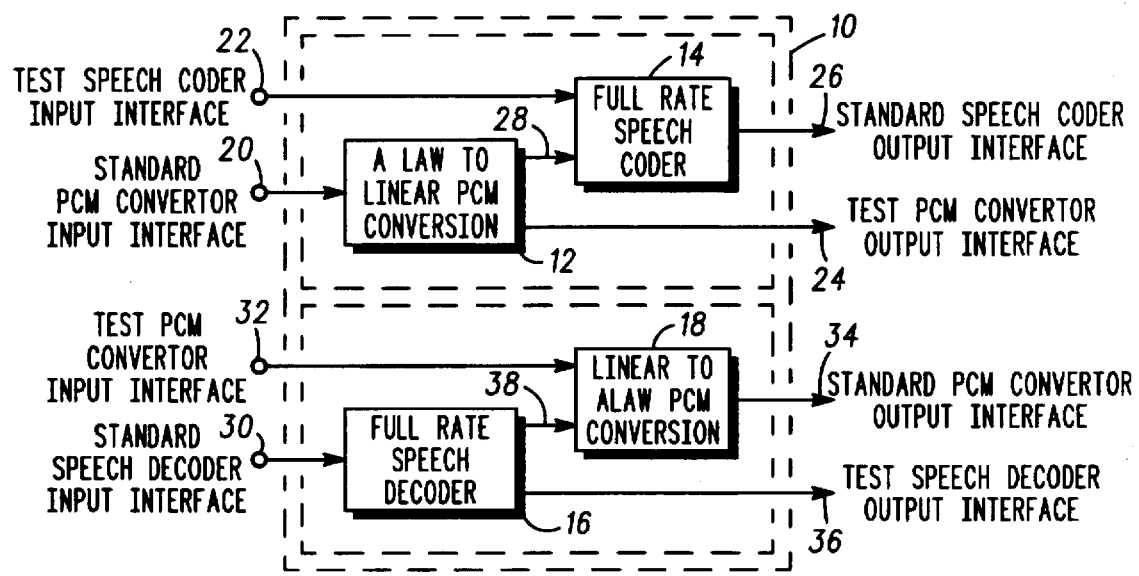
FIG. 1 is a block diagram according to a testing method of the prior art.

FIG. 1 shows a speech transcoder 10 including a block diagram representative of a Alaw to linear PCM conversion module 12, a full rate speech coder 14, a full rate speech decoder 16 and a linear to Alaw PCM conversion module 18. In standard operation, input signals are provided at a standard PCM converter input interface 20 of the Alaw to linear PCM conversion module 12. An output 28 of the Alaw to linear PCM conversion module 12 is inputted to the full rate speech coder 14. The full rate speech coder 14 outputs to a standard speech coder output interface 26. Input is provided at a standard speech decoder interface 30 of the full rate speech decoder 16. An output 38 of the full rate speech decoder 16 is inputted to the linear to Alaw PCM conversion module 18. The linear to Alaw PCM conversion module 18 outputs to a standard PCM converter output interface 34.

Figure 2:
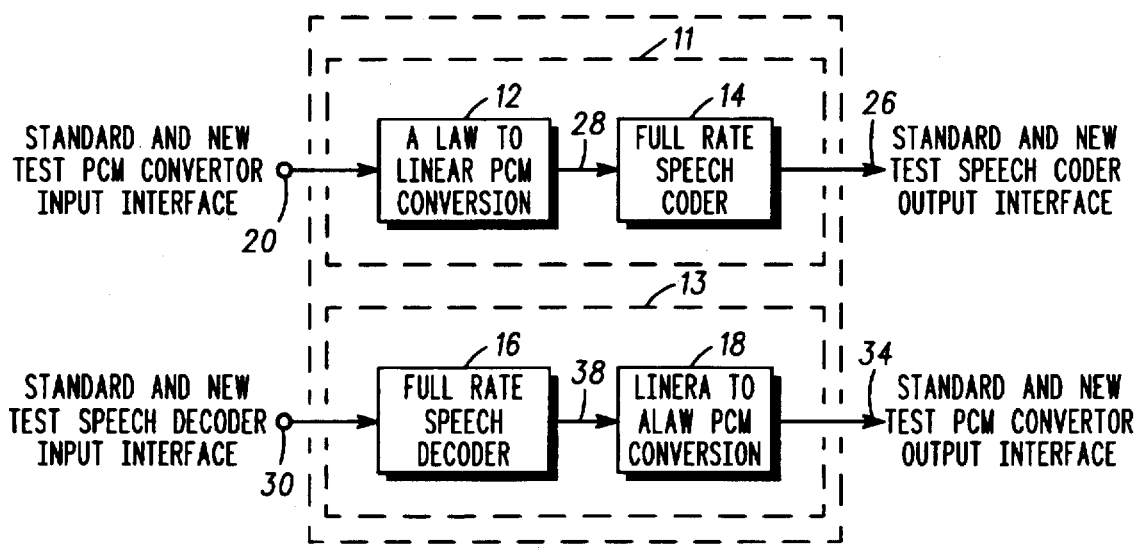
FIG. 2 is a block diagram according to a testing method of the present invention.

Referring to FIG. 2, a preferred embodiment of the present invention includes inputting standard input test vectors at the standard speech decoder interface 30 and outputting a result from the standard PCM converter output interface 34. This tests the combination 13 of speech decoder 16 and PCM conversion module 18.

Simultaneously, a second reference input (or vector) is inputted to the Alaw to linear PCM conversion module 12 at the standard PCM converter interface 20 and outputting a result from the full rate speech coder module 14 at the standard speech coder output interface 26. This tests the combination 11 of PCM conversion module 12 and speech coder module 14.

Reference vectors to test combination module 11 are generated by passing the standard input vectors (or input files) for the speech coder module 14 through a linear to Alaw format converter and back again through a Alaw to linear PCM converter. The double reversed linear speech coder input files may now be different from the original speech coder files. If this is the case, then these new files can be passed through the reference speech coder to produce the bit exact compressed speech output files that correspond to the double reversed linear files, or the new compressed speech output vectors. Hence, we now will have a set of Alaw PCM (at 64 bit/s standard interface) files that can be fed into the Alaw to linear conversion module 12 and speech coder module 14 combination having corresponding compressed speech (at 13 or 16 kbit/s standard interface) files that will be output from the speech coder module 14 that can be compared to the new compressed speech output vectors.

Reference files for modules of the combination module 13 Reference files for output of the speech decoder module 16 and linear to Alaw conversion module combination requires the existing speech decoder output files to be passed through a reference linear to Alaw conversion module. This then enables the existing standard compressed speech decoder input files (at 13 or 16 kbit/s standard interface) to be passed through the combined speech decoder module 16 plus the reference linear to Alaw conversion module 18 to produce Alaw PCM at the 64 kbit/s standard interface 34.

Figure 3:
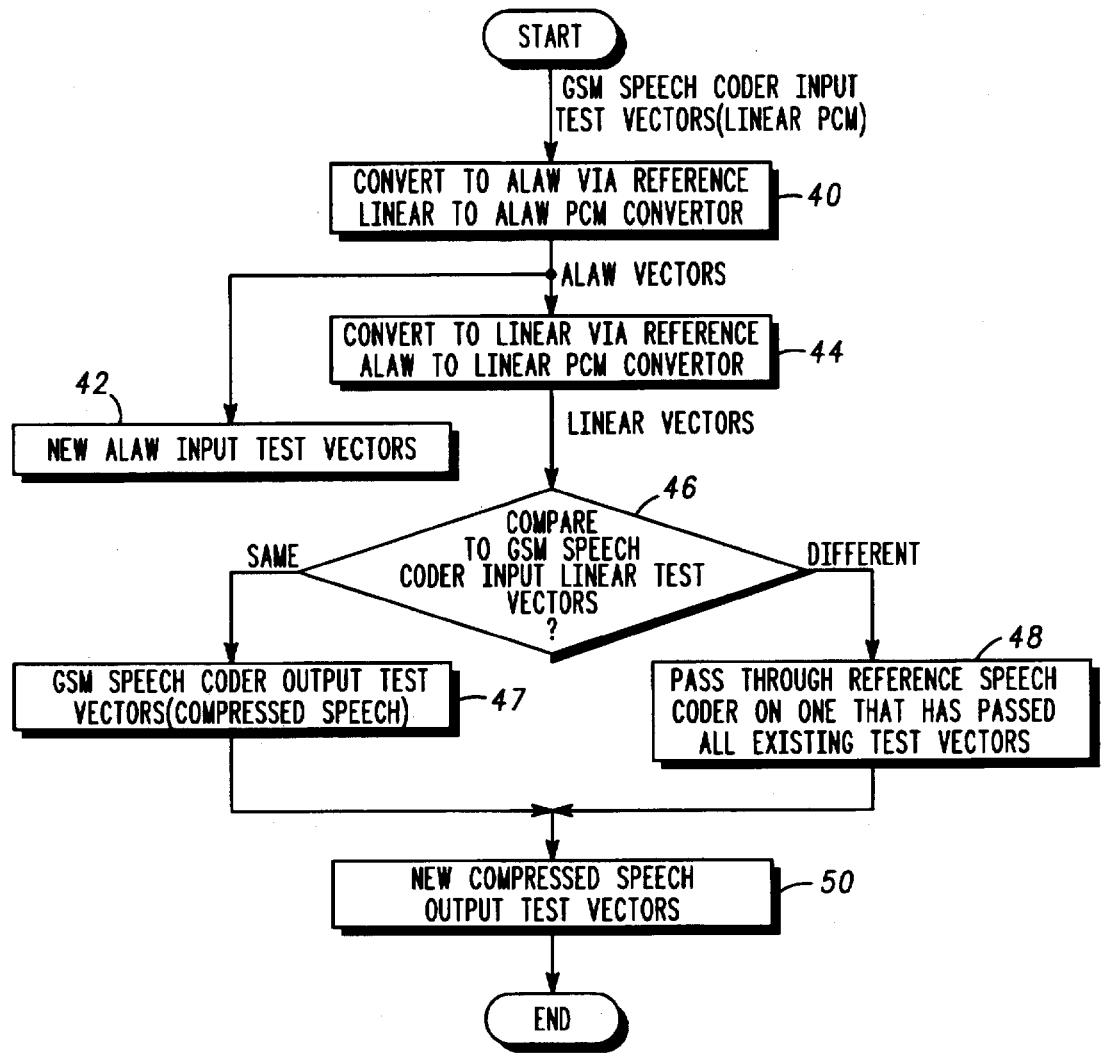
FIG. 3 is a flow chart for generating new compressed speech output test vectors method according to a preferred embodiment of the present invention.

FIG. 3 shows a flow chart for generating new compressed speech output test vectors to be used in the speech coder test according to the present invention. In step 40, the standard GSM speech coder input test vectors which are linear PCM are converted to Alaw by a reference linear to Alaw PCM converter as in step 40. Step 40 generates new Alaw vectors, passed in step 42, which are used in the speech coder test later described with reference to FIG. 5 and 7.

In FIG. 3, the new Alaw vectors are convened back to linear vectors by a reference Alaw to linear PCM converter. The resulting vectors are compared in step 46 to the GSM speech coder input linear test vectors that were originally used as input in step 40. If they are the same then the corresponding GSM speech coder output test vectors become new compressed speech output test vectors, steps 47 and 50.

If the linear vectors produced in step 44 are different from the GSM speech coder input linear test vectors as compared in step 46 then the linear vectors are passed through a reference speech coder in step 48 to generate new compressed speech output test vectors as in step 50. The reference speech coder of step 48 may alternatively be a speech coder that has passed all existing test vectors successfully.

Figure 4:
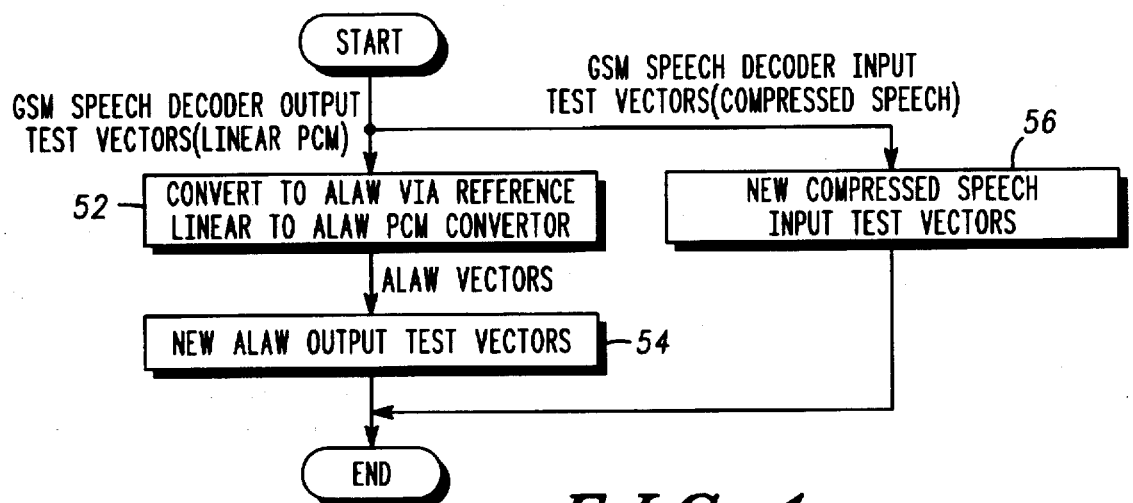
FIG. 4 is a flow chart for generating new speech decoder/ PCM conversion module test vectors according to a preferred embodiment of the present invention.

FIG. 4 describes how new speech decoder/PCM conversion module test vectors are generated. In step 52, the GSM speech decoder output test vectors which are linear PCM are converted to Alaw by a reference linear to Alaw PCM converter. The resulting Alaw vectors become the new Alaw output test vectors in step 54, reference vectors. In step 56, the GSM speech decoder input test vectors which are compressed speech become the new compressed speech input test vectors. The vectors from steps 56 and 54 become the input and output test vectors described with reference to FIGS. 6 and 7.

Figure 5:
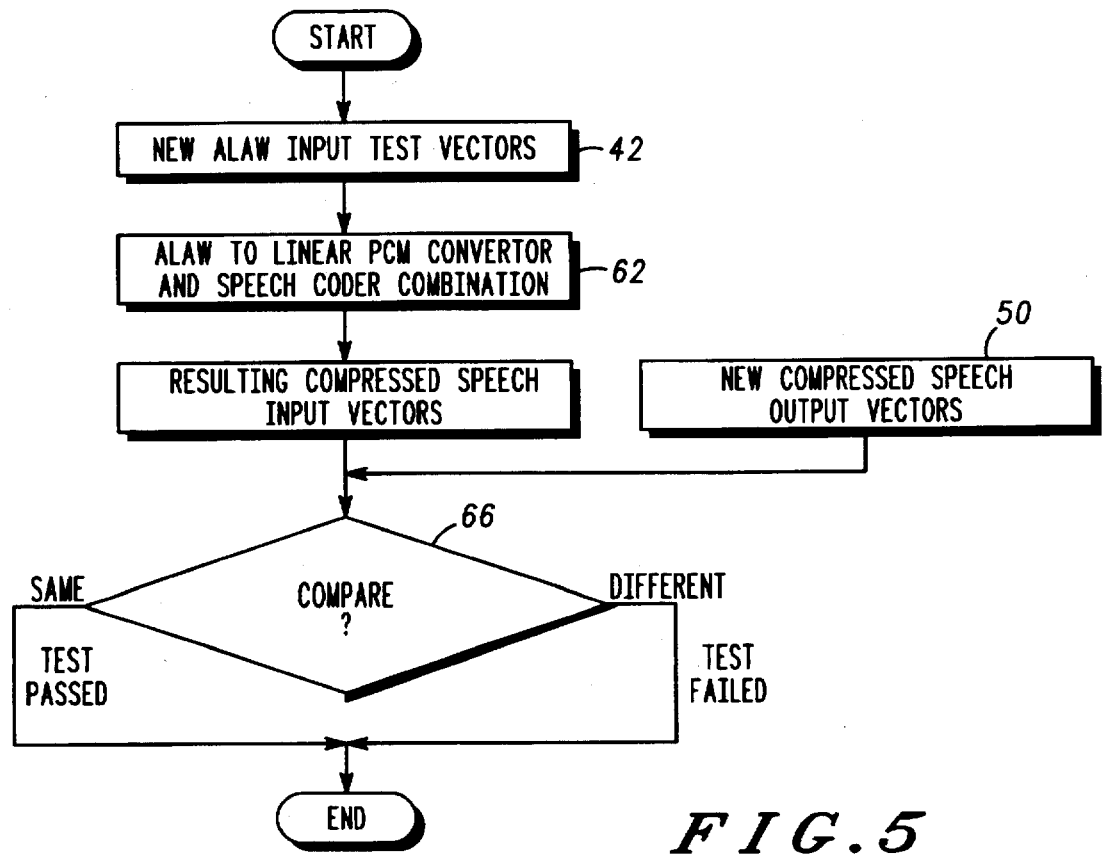
FIG. 5 is a flow chart for the execution of the PCM conversion module and speech coder combination test according to the present invention.

FIG. 5 describes the execution of the PCM conversion module and speech coder combination test with new test vectors according to the present invention. The new Alaw input test vectors that were generated in step 42 of FIG. 3 are inputted in step 62 to the Alaw to linear PCM conversion module 12 and speech coder 14 combination 11 of FIG. 2. The resulting speech output vectors are compared in step 66 to the new compressed speech output vectors that were generated in step 50 of FIG. 3. If the vectors are the same then the Alaw to linear PCM conversion module and speech coder combination 11 passes the test. If the vectors are different the Alaw to linear PCM conversion module and speech coder combination 11 fails the test.

Figure 6:
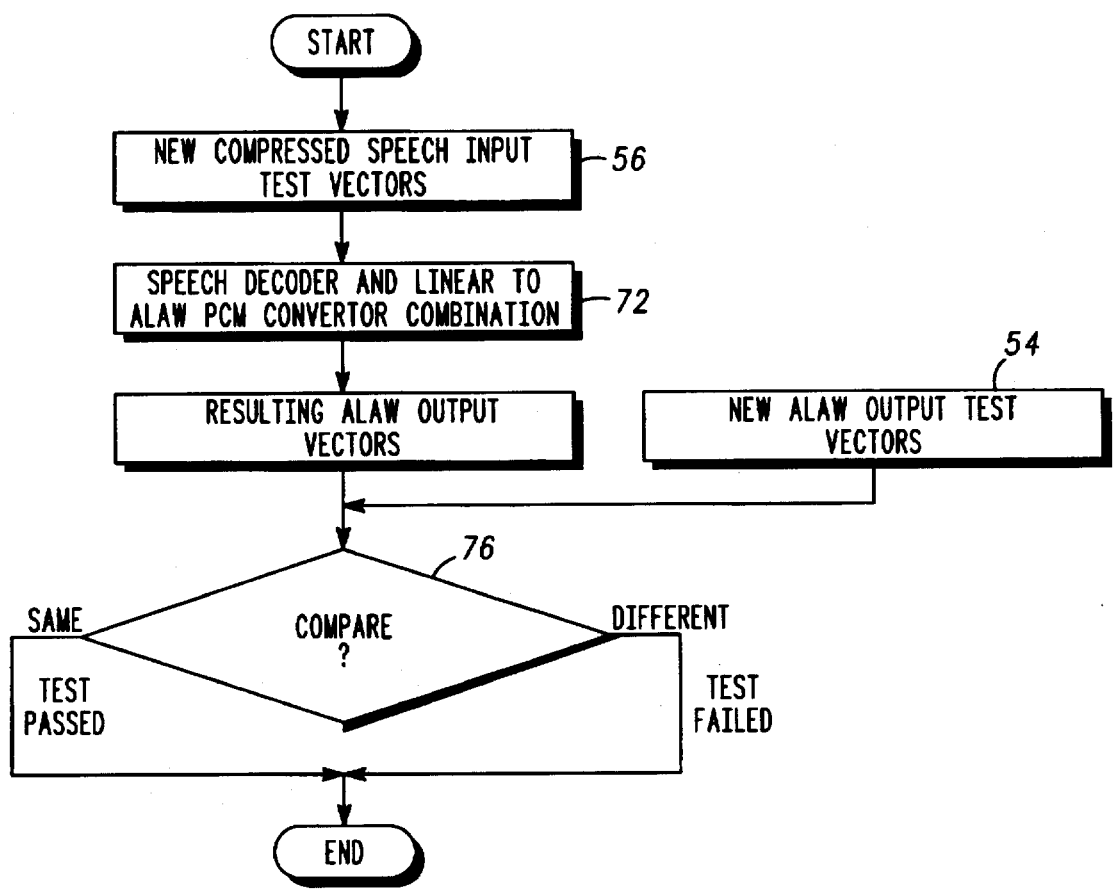
FIG. 6 is a flow chart for the execution of the speech decoder and PCM conversion module combination test according to the present invention.

FIG. 6 describes the execution of the speech decoder and PCM conversion module combination test with new test vectors. The new compressed speech input test vectors that were generated in step 56 of FIG. 4 are input in step 72 to the speech decoder 16 and linear to Alaw PCM conversion module 18 of FIG. 2. The resulting Alaw output vectors are compared in step 76 to the new Alaw output test vectors of step 54 of FIG. 4. If the vectors are the same then the speech decoder and linear to Alaw PCM conversion module combination 13 passes the test. If the vectors are different the speech decoder and linear to Alaw PCM conversion module combination 13 fails the test.

Figure 7:
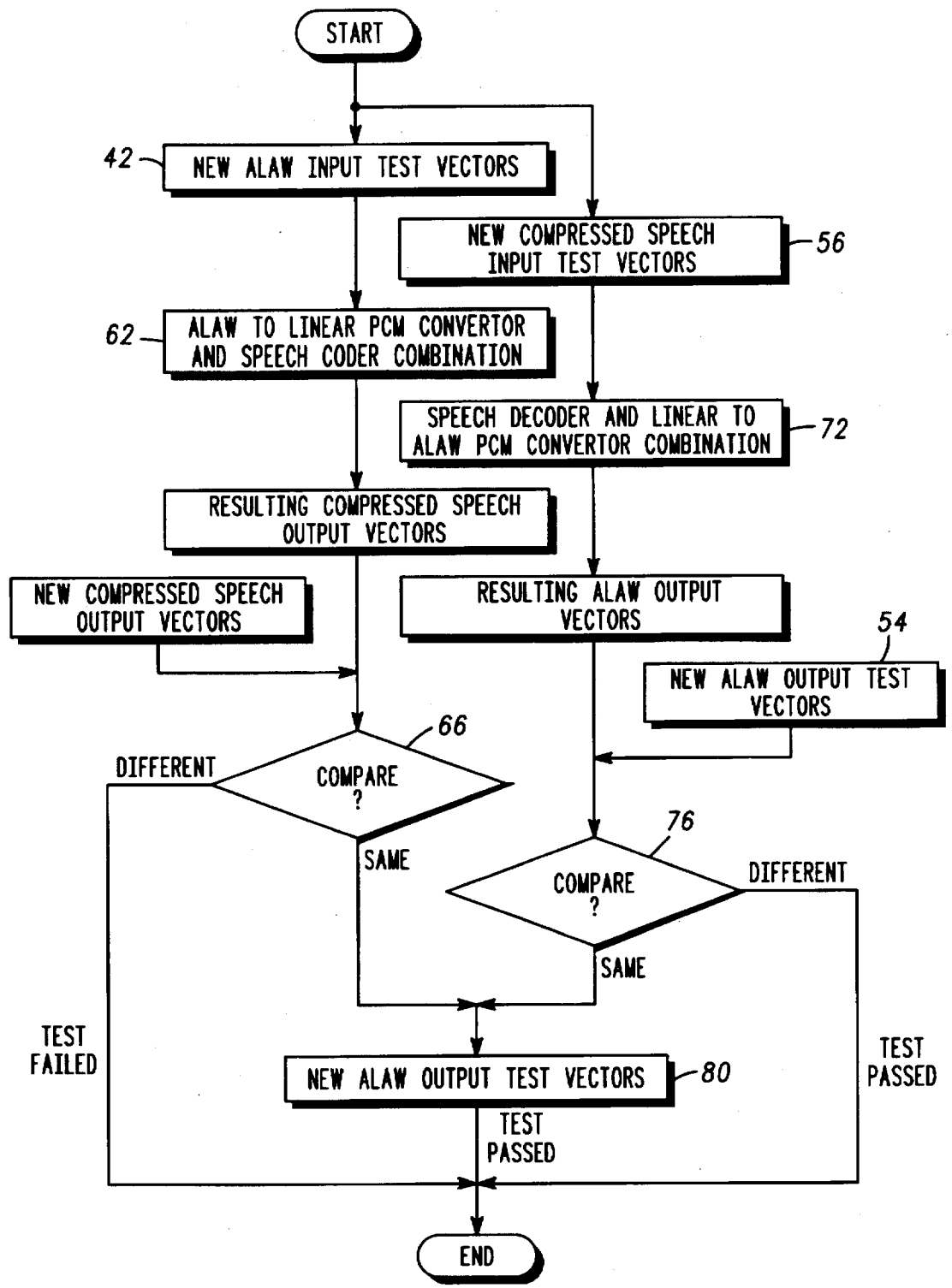
FIG. 7 is a flow chart for a method of testing a transcoder according to a further embodiment of the present invention.

FIG. 7 describes execution of the method of testing all of the transcoder modules 10 simultaneously. FIG. 7 is basically a combination of FIGS. 5 and 6 with the additional step 80 where if both tests are successful the transcoder modules have successfully completed the testing.

By having the new Alaw to compressed speech and compressed speech to Alaw test vectors, it now becomes possible to input test vectors into the speech coder combination 12, 14 and the speech decoder combination 16, 18 at the same time, FIG. 2. This removes the need for special test interfaces for this test and also ensures that all four modules must be running during the test.

The pre-existing four tests allow a reset signal to be multiplexed into the data stream so as to ensure a pre-defined start point. The testing method of the present invention also accommodates this in a similar fashion which is manufacturer definable. In fact, as all four modules will run in this test, there is only a need for one reset signal.

The speech transcoder at the BSC or MSC site interfaces at the BTS side via TRAU (Transcoder and Rate Adapter Unit) frames using the remote control protocol as defined by GSM Recommendation 08.60. For the purposes of start up, the testing method of the present invention needs a few dummy frames until the speech transcoder has aligned to the incoming TRAU frame structure. Once aligned, the speech coder can reset and start inputting the Alaw vectors, whilst the speech decoder will get its compressed speech from the TRAU frames. The need to disable DTX (Discontinuous Transmission) will still exist in this test as, like it does in the existing four tests, as DTX is not a part of this test.

GSM 11.20 defines a way to measure the speech transcoder delay. The delay is measured by using the output from the four existing bit exact tests. The time between input to output is analysed off-line using the input and output files and the known timing between them and the know timing between data samples in the input and output files.

The testing method of the present invention may also be used to improve the delay measurement calculation. A further embodiment would include using the input and output vectors from the test of the present invention and then use the same off-line method as in prior art. The advantage being that there are no extra quantization effects as no extra inputs or outputs are used.

Thus, the method of the present invention provides a fifth bit exact test as at least a supplement to the existing four testing methods described above. The method of the present invention tests all four modules described above at the same time in normal operational mode and through the normal operational speech transcoder interface points.

The test files for this test can be taken from those existing for the speech coder and speech decoder modules.

Also, the present invention provides a more reliable test for the delay exhibited by the four bit-exact modules.

Although the present invention has been described with reference to a full rate speech transcoder it may also be applied to a half rate speech transcoder.

The method of the present invention may also be applied in the mobile environment for testing of speech coder and decoder modules.

Thus, the method of the present invention provides a fifth bit exact test that allows the use the standard interfaces between the PCM converter module 12 and the full rate speech coder module 14 and the full rate speech decoder module 16 and the PCM converter module 14 and there is no need for additional test interfaces. The testing method of the present invention is via standard interfaces and all four modules may be tested at the same time.

I claim:

1. A method of testing a speech transcoder including at least a speech decoder module connected to a PCM format conversion module, the method of testing comprising the steps of:

inputting a standard input vector into an input of the decoder module; and outputting a reference vector from the PCM format conversion module.

2. A method of testing a speech transcoder including a first PCM format conversion module connected to a speech coder module, the method comprising the steps of:

inputting a reference vector into the first PCM format conversion module; and outputting a new vector from the speech coder that is equivalent to standard speech coder output or equivalent to a vector that was generated by inputting standard speech coder input into a combination of two PCM conversion modules and a reference speech coder.

3. A method of testing a speech transcoder including at least a speech decoder module connected to a first PCM format conversion module and a second PCM format conversion module connected to a speech coder module, the method of testing comprising the steps of:

inputting a standard input vector into an input of the decoder module;

outputting a reference vector from the first PCM format conversion module, while simultaneously;

inputting a second reference vector into the second PCM format conversion module; and outputting a new vector from the speech coder that is equivalent to standard speech coder output or equivalent to a vector that was generated by inputting standard speech coder input into a combination of two PCM conversion modules and a reference speech coder.

4. The method of claim 3 wherein the second reference vector is generated by the step of inputting standard speech coder input test vectors into a reference PCM conversion module.

5. The method of any of the above claims wherein the PCM format conversion modules are either a linear to Alaw PCM conversion module or a Alaw to linear PCM conversion module.

6. The method of claim 1 wherein the speech decoder is a full rate speech decoder.

7. The method of claims 1 wherein the speech decoder is a half rate speech decoder.

* * * * *